United States Patent
Sun et al.

(10) Patent No.: US 12,336,146 B2
(45) Date of Patent: Jun. 17, 2025

(54) TEMPERATURE EQUALIZATION COMPONENT AND ELECTRONIC DEVICE

(71) Applicant: HUAWEI TECHNOLOGIES CO., LTD., Guangdong (CN)

(72) Inventors: Yongfu Sun, Shenzhen (CN); Jian Shi, Shanghai (CN); Zhi Yuan, Shanghai (CN); Linfang Jin, Dongguan (CN); Jie Yang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 521 days.

(21) Appl. No.: 17/732,684

(22) Filed: Apr. 29, 2022

(65) Prior Publication Data
US 2022/0256740 A1    Aug. 11, 2022

Related U.S. Application Data

(63) Continuation of application No. PCT/CN2020/092146, filed on May 25, 2020.

(30) Foreign Application Priority Data

Oct. 31, 2019    (CN) .......................... 201911056497.8

(51) Int. Cl.
*H05K 7/20* (2006.01)
(52) U.S. Cl.
CPC ................................. *H05K 7/20336* (2013.01)
(58) Field of Classification Search
CPC ............ H05K 7/20336; H05K 7/20445; G06F 2200/201; G06F 1/203
See application file for complete search history.

(56) References Cited

U.S. PATENT DOCUMENTS

| | | | |
|---|---|---|---|
| 7,913,748 B2 * | 3/2011 | Lin | ...................... F28D 15/0233 165/80.4 |
| 2006/0162906 A1 * | 7/2006 | Hong | .................... F28D 15/046 165/146 |

(Continued)

FOREIGN PATENT DOCUMENTS

| CN | 101639331 A | 2/2010 |
|---|---|---|
| CN | 202182665 U | 4/2012 |

(Continued)

OTHER PUBLICATIONS

Chen Wenge, Powder metallurgy process and materials, 2011, 1 page (abstract).

(Continued)

*Primary Examiner* — Lionel Nouketcha

(57) ABSTRACT

A temperature equalization component and an electronic device are disclosed. The temperature equalization component may include a housing and a capillary structure. The housing may include a cavity, and the capillary structure is located in the cavity and is disposed on a side of the housing that faces a heating element. The housing is provided with a first protrusion part and/or a first depression part, and the temperature equalization component is in direct contact with the heating element by using the first protrusion part and/or the first depression part, thereby improving heat transfer efficiency, reducing a probability that heat accumulates around the heating element, and improving a heat dissipation effect of the temperature equalization component.

18 Claims, 8 Drawing Sheets

(56) References Cited

U.S. PATENT DOCUMENTS

2011/0120674 A1* 5/2011 MacDonald .......... F28D 15/046
                                                29/890.03
2015/0055300 A1* 2/2015 Hsieh ..................... G06F 1/20
                                                165/104.26
2016/0135336 A1* 5/2016 Wu ..................... H05K 7/2039
                                                361/818

FOREIGN PATENT DOCUMENTS

| CN | 103209570 A | 7/2013 |
| CN | 204046918 U | 12/2014 |
| CN | 204350550 U | 5/2015 |
| CN | 206919724 U | 1/2018 |
| CN | 108109975 A | 6/2018 |
| CN | 109121354 A | 1/2019 |
| CN | 110430736 A | 11/2019 |
| CN | 110708934 A | 1/2020 |
| JP | 2009076622 A | 4/2009 |
| TW | 201300718 A | 1/2013 |
| TW | I479113 B | 4/2015 |
| TW | M547094 U | 8/2017 |

OTHER PUBLICATIONS

International Search Report and Written Opinion issued in PCT/CN2020/092146, dated Aug. 26, 2020.
Office Action issued in CN201911056497.8, dated Jun. 3, 2020, 6 pages.
Office Action issued in CN201911056497.8, dated Jan. 28, 2022, 6 pages.
Extended European Search Report issued in EP20880755.2, dated Oct. 21, 2022, 7 pages.

* cited by examiner

A-A

E-E

TEMPERATURE EQUALIZATION COMPONENT AND ELECTRONIC DEVICE

CROSS-REFERENCE TO RELATED APPLICATIONS

This application is a continuation of International Application No. PCT/CN2020/092146, filed on May 25, 2020, which claims priority to Chinese Patent Application No. 201911056497.8, filed on Oct. 31, 2019. The disclosures of the aforementioned applications are hereby incorporated by reference in their entireties.

TECHNICAL FIELD

This application relates to the field of heat dissipation technologies, and in particular, to a temperature equalization component and an electronic device.

BACKGROUND

Generally, a temperature equalization component is disposed inside an electronic device such as a mobile phone or a tablet computer, to dissipate heat from a heating element of the electronic device. Specifically, a copper block is disposed between the temperature equalization component and the heating element, and the copper block is in contact with the temperature equalization component and the heating element. Heat emitted by the heating element can be absorbed by the temperature equalization component only after being conducted by the copper block, and therefore heat dissipation efficiency of the temperature equalization component is affected by a heat conduction capability of the copper block. As a result, heat dissipation efficiency is low, and heat is prone to accumulate near the heating element, which affects normal working of a surrounding heating element.

SUMMARY

In view of the existing problem described in the background, an objective of this application is to provide a temperature equalization component and an electronic device. The temperature equalization component and the electronic device can resolve a problem of low heat dissipation efficiency of the temperature equalization component.

An embodiment of this application provides a temperature equalization component, including a housing and a capillary structure, where the housing includes a cavity, and the capillary structure is located in the cavity.

The housing is provided with a first protrusion part and/or a first depression part, and the first protrusion part and/or the first depression part are/is configured to be in contact with a heating element.

The capillary structure is disposed on a side of the housing that is close to a side of the heating element.

The housing of the temperature equalization component is provided with the first protrusion part and/or the first depression part, so that the temperature equalization component can be in direct contact with the heating element, a copper block used for heat transfer is omitted, and factors affecting heat transfer efficiency are reduced, thereby improving efficiency of heat conduction between the heating element and the temperature equalization component, and further improving heat dissipation efficiency of the temperature equalization component.

In a possible implementation, the housing includes a first cover plate, and the first cover plate is close to the heating element.

The first cover plate includes a body part, the first protrusion part and/or the first depression part are/is disposed on the first cover plate, the first protrusion part protrudes from the body part, and/or the first depression part depresses relative to the body part.

The capillary structure covers the body part, the first protrusion part, and/or the first depression part.

The housing may include the first cover plate, the first cover plate is disposed on a side of the housing that faces the heating element, and the first cover plate may include the body part. The first protrusion part and/or the first depression part are/is disposed on the first cover plate, so that the first protrusion part and/or the first depression part can be in direct contact with the heating element. The capillary structure is disposed on the first cover plate, so that a distance between the capillary structure and the heating element can be shortened, thereby improving heat dissipation efficiency of the temperature equalization component. The capillary structure covers the first cover plate, the first protrusion part, and/or the first depression part, so that a heat dissipation area can be enlarged, thereby further improving heat dissipation efficiency of the temperature equalization component.

In a possible implementation, the first depression part depresses towards the inside of the cavity.

The first depression part includes a first contact surface, the first contact surface is configured to be in contact with the heating element, and an area of the first contact surface is greater than an area of the heating element in contact with the first contact surface.

The area of the first contact surface is greater than the area of the heating element, and this is more helpful for the temperature equalization component to be in contact with the heating element, so that the first contact surface is in full contact with the heating element, thereby improving heat dissipation efficiency of the temperature equalization component.

In a possible implementation, the housing further includes a second cover plate disposed opposite to the first cover plate, a second depression part is disposed on a side of the second cover plate that is away from the heating element, and the second depression part has a same depression direction as the first depression part.

At least a part of the first depression part extends into the second depression part.

The second depression part is disposed on the second cover plate to avoid the first depression part, so that the first depression part can depress by a depth that is large enough. When the heating element has a relatively large height, the first depression part can still be in contact with the heating element, and an overall thickness of the temperature equalization component can be decreased, thereby making an electronic device thinner.

In a possible implementation, the first cover plate is provided with the first protrusion part and the first depression part, the first protrusion part protrudes towards the outside of the cavity, and the first depression part depresses towards the inside of the cavity.

The first protrusion part is configured to be in contact with one part of the heating element, and the first depression part is configured to be in contact with the other part of the heating element.

Both the first protrusion part and the first depression part are disposed on the first cover plate, so that the temperature equalization component can be simultaneously in contact with a plurality of heating elements of different heights, and simultaneously dissipate heat from the plurality of heating elements, thereby improving utilization of the temperature equalization component and reducing costs.

In a possible implementation, the first protrusion part includes a second contact surface, the second contact surface is configured to be in contact with the heating element, and an area of the second contact surface is greater than an area of the heating element in contact with the second contact surface.

The first depression part includes a first contact surface, the first contact surface is configured to be in contact with the heating element, and an area of the first contact surface is greater than an area of the heating element in contact with the first contact surface.

The areas of the first contact surface and the second contact surface both are greater than the areas of the heating elements respectively in contact with the first contact area and the second contact area. This design enables the first protrusion part and the first depression part to be in full contact with the heating element, thereby improving heat dissipation efficiency of the temperature equalization component.

In a possible implementation, the capillary structure includes a first capillary structure and a second capillary structure, and a capillary rate of the second capillary structure is greater than a capillary rate of the first capillary structure.

The first capillary structure and the second capillary structure with different capillary rates are disposed, so that the capillary structure can store more heat-conducting media, and this is more helpful for the capillary structure to collect a returned heat-conducting medium.

In a possible implementation, the first capillary structure is pressed against the second capillary structure in a thickness direction of the temperature equalization component.

An area of the second capillary structure is less than an area of the first capillary structure.

The first capillary structure is pressed against the second capillary structure, so that an overall thickness of the temperature equalization component can be decreased. A channel can be formed at a location at which the second capillary structure is not disposed, so that a heat-conducting medium that generates a phase change flows out of the capillary structure to take heat away from the heating element, thereby reducing a probability of heat accumulation and improving a heat dissipation effect of the temperature equalization component.

In a possible implementation, the capillary structure is pressed against the housing to support the housing.

A capillary structure formed by sintering metal powder or another capillary structure with relatively high strength is disposed, to support the housing of the temperature equalization component.

In a possible implementation, the capillary structure is provided with a second protrusion part and/or a third depression part, the second protrusion part is disposed corresponding to the first protrusion part, and the third depression part is disposed corresponding to the first depression part.

The second protrusion part is pressed against the first protrusion part and a second cover plate of the housing, and/or the third depression part is pressed against the first depression part and the second cover plate.

The capillary structure is provided with the second protrusion part and/or the third depression part to support the first protrusion part and/or the first depression part, thereby improving structural strength of the temperature equalization component.

In a possible implementation, the housing includes the first cover plate and a second cover plate that are disposed opposite to each other.

The temperature equalization component includes a support structure, the support structure is located in the cavity, and the support structure is configured to support the first cover plate and the second cover plate.

The support structure is disposed in the cavity to improve overall strength of the temperature equalization component, and reduce a probability that the housing is deformed when being extruded by external force, to reverse sufficient space for a heat-conducting medium whose phase changes, so that the heat-conducting medium can be away from the heating element and release heat, thereby improving a heat dissipation effect of the temperature equalization component.

In a possible implementation, the support structure includes a support pole.

The support pole and the housing are integrally formed; or the support pole and the housing are in separated structures, and two ends of the support pole are respectively pressed against the housing and the capillary structure.

The support structure may include the support pole. The support pole may be integrally formed with the housing during processing to simplify processing steps, or may be formed separately. When the temperature equalization component is assembled, support poles with different lengths may be selected based on an actual requirement, so that use of the support pole is more flexible.

In a possible implementation, the first cover plate includes the body part, the first protrusion part and/or the first depression part are/is disposed on the first cover plate, the first protrusion part protrudes from the body part, and/or the first depression part depresses relative to the body part.

The support structure includes a foam metal layer and a support pole, and the support pole is configured to support the body part and the second cover plate.

The foam metal layer is configured to support the first protrusion part and the second cover plate, and/or the foam metal layer is configured to support the first depression part and the second cover plate.

The foam metal layer is provided with a through-hole, and the through-hole penetrates the foam metal layer in a thickness direction.

The foam metal layer is disposed to support the first protrusion part and/or the first depression part, to reduce a probability that a heat dissipation effect of the temperature equalization component is reduced due to deformation of the first protrusion part and/or the first depression part. The foam metal layer may be provided with the through-hole, and a heat-conducting medium whose phase changes can be away from the heating element along the through-hole, thereby reducing a probability of heat accumulation and improving a heat dissipation effect of the temperature equalization component.

In a possible implementation, the temperature equalization component includes an avoidance hole, and the avoidance hole penetrates the temperature equalization component in a thickness direction of the temperature equalization component.

The temperature equalization component is provided with the avoidance hole to avoid a heating element whose height is relatively large and heat generation amount is relatively small, thereby decreasing a thickness of the temperature equalization component and making an overall thickness of an electronic device smaller.

A second aspect of this application provides an electronic device, and the electronic device includes a heating element, a mounting bracket, and a temperature equalization component. The temperature equalization component is connected to the mounting bracket, the mounting bracket includes a connecting hole, and the heating element is pressed against the first protrusion part and/or the first depression part by using the connecting hole.

The temperature equalization component is the temperature equalization component according to any of the embodiments.

The temperature equalization component is disposed inside the electronic device by using the mounting bracket, and is in contact with the heating element by using the connecting hole, thereby improving heat transfer efficiency of the temperature equalization component, and reducing a probability that the electronic device is hot or frozen.

In a possible implementation, the housing includes a first cover plate, the first cover plate includes a body part, and the first protrusion part and/or the first depression part are/is disposed on the first cover plate.

The connecting hole includes a first hole segment and a second hole segment, the first hole segment and the second hole segment are connected to each other, a cross-sectional area of the first hole segment is less than a cross-sectional area of the second hole segment, and a step surface is formed between the first hole segment and the second hole segment.

The body part is located in the second hole segment, and is pressed against the step surface.

At least a part of at least one of the first protrusion part, the first depression part, and the heating element is located in the first hole segment.

The first hole segment and the second hole segment with different areas are disposed, so that the body part of the temperature equalization component is installed in the second hole segment. The heating element is in contact with the temperature equalization component by using the first hole segment, thereby decreasing an overall thickness of the electronic device, and helping to position the heating element and the temperature equalization component during installation.

The temperature equalization component provided in the embodiments of this application may include the housing and the capillary structure, and the housing is provided with the first protrusion part and/or the first depression part. The temperature equalization component is in direct contact with the heating element by using the first protrusion part and/or the first depression part, so that a copper block that is between the temperature equalization component and the heating element and that is used for heat transfer is omitted, and factors affecting heat transfer efficiency are reduced. Heat is directly transferred through contact heat conduction, thereby improving heat transfer efficiency and improving a heat dissipation effect of the temperature equalization component.

It should be understood that the foregoing general description and the following detailed description are merely examples, and cannot limit this application.

REFERENCE SIGNS

Figure 1:
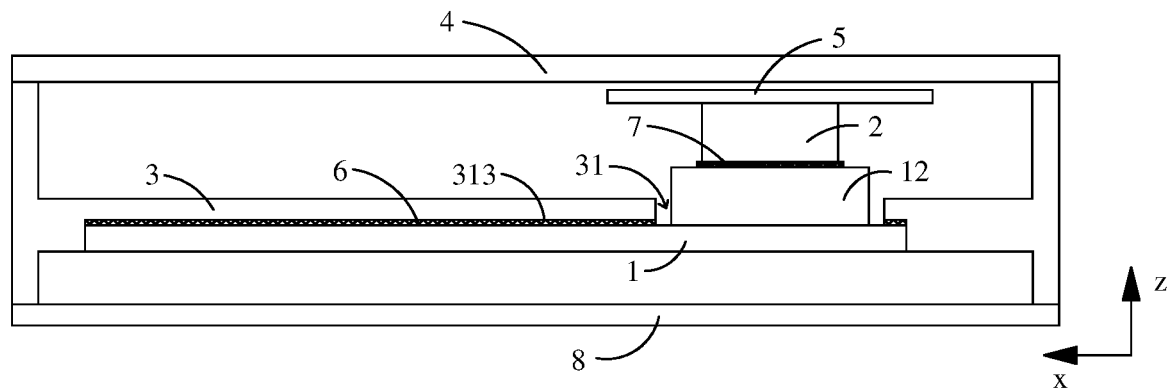
FIG. 1 is a schematic diagram of a structure in which a temperature equalization component is applied to an electronic device according to an embodiment of this application.

1—temperature equalization component;
11—housing;
111—cavity;
112—first protrusion part;
112a—second contact surface;
113—first depression part;
113a—first contact surface;
114—first cover plate;
114a—body part;
115—second cover plate;
115a—second depression part;
116—avoidance hole;
12—capillary structure;
121—first capillary structure;
122—second capillary structure;
123—second protrusion part;
124—third depression part;
13—support structure;
131—support pole;
132—foam metal layer;
132a—through-hole;
2—heating element;
3—mounting bracket;
31—connecting hole;
311—first hole segment;
312—second hole segment;
313—step surface;
4—housing;
5—circuit board;
6—adhesive substance;
7—heat-conducting interface material; and
8—screen.

The accompanying drawings herein are incorporated into the specification and form a part of the specification, show embodiments conforming to this application, and are used together with the specification to explain a principle of this application.

DESCRIPTION OF EMBODIMENTS

To better understand the technical solutions of this application, the following describes the embodiments of this application in detail with reference to the accompanying drawings.

It should be noted that the described embodiments are merely a part rather than all of the embodiments of this application. All other embodiments obtained by a person of ordinary skill in the art based on the embodiments of this application without creative efforts shall fall within the protection scope of this application.

The terms used in the embodiments of this application are merely for the purpose of illustrating specific embodiments, and are not intended to limit this application. The terms "a", "the", and "this" of singular forms used in the embodiments and the appended claims of this application are also intended to include plural forms, unless otherwise specified in a context clearly.

It should be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally represents an "or" relationship between the associated objects.

It should be noted that, position words such as "above", "below", "left", and "right" described in the embodiments of this application are described from angles shown in the accompanying drawings, and should not be understood as a limitation on the embodiments of this application. Moreover, in the context, it also should be understood that, when it is mentioned that one element is connected "above" or "below" another element, it cannot only be directly connected "above" or "below" the another element, but also be indirectly connected "above" or "below" the another element by using an intermediate element.

A temperature equalization component 1 is used as a heat dissipation component inside an electronic device such as a mobile phone or a tablet computer, to absorb heat generated by a heating element 2 inside the electronic device. A housing 11 of the temperature equalization component 1 may use a metal material with good heat conductivity, such as copper. A capillary structure 12 is disposed inside the temperature equalization component 1, and the heat generated by the heating element 2 is absorbed by using a heat-conducting medium in the capillary structure 12, so that the heating element 2 is in a good working state. Generally, the temperature equalization component 1 is in a flat structure, that is, a thickness of the temperature equalization component 1 is unchanged or the thickness slightly changes in a length direction X or width direction Y of the temperature equalization component 1. However, heights of heating elements 2 inside the electronic device are inconsistent, and therefore the flat temperature equalization component 1 cannot be in direct contact with the heating element 2, and a copper block needs to be disposed between the temperature equalization component 1 and the heating element 2 to conduct, by using the copper block, the heat generated by the heating element 2 to the temperature equalization component 1, to be absorbed by the temperature equalization component 1. Because the temperature equalization component 1 cannot be in direct contact with the heating element 2 and absorb heat, heat dissipation efficiency of the temperature equalization component 1 is reduced in this manner. As a result, heat accumulates around the heating element 2, and temperature of the heating element 2 and temperature of an environment in which the heating element 2 is located increase. Consequently, the heating element 2 cannot work normally, and the electronic device is hot or frozen, affecting use of the electronic device.

To resolve this technical problem, the embodiments of this application provide a temperature equalization component 1 and an electronic device. The temperature equalization component 1 may be a vapor chamber (VC). The temperature equalization component 1 can be in direct contact with the heating element 2, and the heat generated by the heating element 2 can be directly transferred to the temperature equalization component 1 to decrease the temperature of the heating element 2, so that the heating element 2 keeps in a good working state, the electronic device is in a normal working state, and use experience is improved.

Specifically, as shown in FIG. 4 to FIG. 15, the temperature equalization component 1 may include a housing 11 and a capillary structure 12. A cavity 111 is formed inside the housing 11, and the capillary structure 12 is located inside the cavity 111. Generally, a heat-conducting medium is in a liquid state and is stored in the capillary structure 12. The cavity 111 of the temperature equalization component 1 may be in a vacuum state. In the vacuum state, the heat-conducting medium can evaporate rapidly after being heated and generate a phase change, changing from a liquid heat-conducting medium to a gaseous heat-conducting medium, and absorb a large amount of heat, thereby improving overall working efficiency of the temperature equalization component 1. The capillary structure 12 not only can store the liquid heat-conducting medium, but also can allow, under a capillary function, the liquid heat-conducting medium to flow in the capillary structure 12 in a fixed direction, that is, flow in a direction towards the heating element 2, so as to shorten a heat conduction distance between the heat-conducting medium and the heating element 2, thereby improving heat dissipation efficiency of the temperature equalization component 1. The capillary structure 12 is disposed on a side of the housing 11 that faces the heating element 2. A heat-conducting medium is disposed inside the capillary structure 12, and the heat-conducting medium may be pure water. The heating element 2 is a heating element 2, such as a chip, that can generate heat inside the electronic device.

As shown in FIG. 4 to FIG. 9, the housing 11 is provided with a first protrusion part 112 and/or a first depression part 113, so that the temperature equalization component 1 forms an unequal-thickness structure in a length direction X or width direction Y of the temperature equalization component 1, thereby helping the temperature equalization component 1 to be in contact with the heating element 2. The housing 11, the first protrusion part 112, and/or the first depression part 113 each is of a material capable of dissipating heat, and disposing of the first protrusion part 112 and/or the first depression part 113 can shorten a distance between the temperature equalization component 1 and the heating element 2. In addition, a structure and size of the first protrusion part 112 and/or a structure and size of the first depression part 113 may be determined based on a location of the heating element 2 in contact with the first protrusion part 112 and/or a location of the heating element 2 in contact with the first depression part 113, so that the temperature equalization component 1 is in contact with the heating element 2 by using the first protrusion part 112 and/or the first depression part 113.

The temperature equalization component 1 may be in direct contact with the heating element 2 by using the first protrusion part 112 and/or the first depression part 113, that is, the temperature equalization component 1 is in contact with the heating element 2 to conduct heat. This manner has advantages of a high heat transfer speed and high efficiency. This design can improve efficiency of heat transfer between the heating element 2 and the temperature equalization component 1, so that heat generated by the heating element 2 is rapidly absorbed by a heat-conducting medium in the temperature equalization component 1, to decrease temperature of the heating element 2 and temperature of a working environment of the heating element 2. Therefore, the heating element 2 is in a good working state, and the electronic device is in a good working state as a whole.

It should be noted herein that the temperature equalization component 1 provided in the embodiments of this application may include a plurality of first protrusion parts 112 and/or a plurality of first depression parts 113, and a quantity of first protrusion parts 112 and a quantity of first depression parts 113 may be set based on an actual situation. For example, when the temperature equalization component 1 provided in the embodiments of this application is applied to an electronic device, the electronic device may include a plurality of heating elements 2. When heights of the heating elements 2 are inconsistent, the quantity and heights of first protrusion parts 112 and/or the quantity and heights of first depression parts 113 may be adjusted based on actual heights of the heating elements 2, so that the temperature equalization component 1 can be in direct contact with the heating elements 2, thereby improving overall working efficiency of the temperature equalization component 1.

Specifically, the housing 11 of the temperature equalization component 1 may include a first cover plate 114. The first cover plate 114 is disposed on a side of the housing 11 that is close to the heating element 2, and the first protrusion part 112 and/or the first depression part 113 configured to be in contact with the heating element 2 may be disposed on the first cover plate 114. The first cover plate 114 may include a body part 114a. The first protrusion part 112 protrudes from the body part 114a, and/or the first depression part 113 depresses relative to the body part 114a, that is, the first protrusion part 112 protrudes towards the outside of the cavity 111, and the first depression part 113 depresses towards the inside of the cavity 111. The capillary structure 12 may be disposed on the first cover plate 114, and covers the body part 114a and the first protrusion part 112 and/or the first depression part 113 disposed on the body part 114a, so as to shorten a distance between the capillary structure 12 and the heating element 2, thereby improving heat transfer efficiency and further improving working efficiency of the temperature equalization component 1.

As shown in FIG. 4 to FIG. 11, in an embodiment provided in this application, the capillary structure 12 may be disposed on only one side of the housing 11, and the capillary structure 12 does not need to be disposed on a side of the housing 11 that is away from the heating element 2. This design not only can meet a heat dissipation requirement of the temperature equalization component 1, but also can decrease a thickness of the temperature equalization component 1, thereby following a trend of lightening and thinning the electronic device.

In a specific embodiment, the capillary structure 12 disposed on the first cover plate 114 may be in a continuous structure, that is, the capillary structure 12 covers each wall surface of the body part 114a, the first protrusion part 112, and/or the first depression part 113. The continuous capillary structure 12 helps a heat-conducting medium to return to a heat source, and can enlarge a contact area between the capillary structure 12 and the first cover plate 114, thereby improving heat absorption efficiency of the heat-conducting medium located in the capillary structure 12, and further improving heat dissipation efficiency of the temperature equalization component 1.

Figure 4:
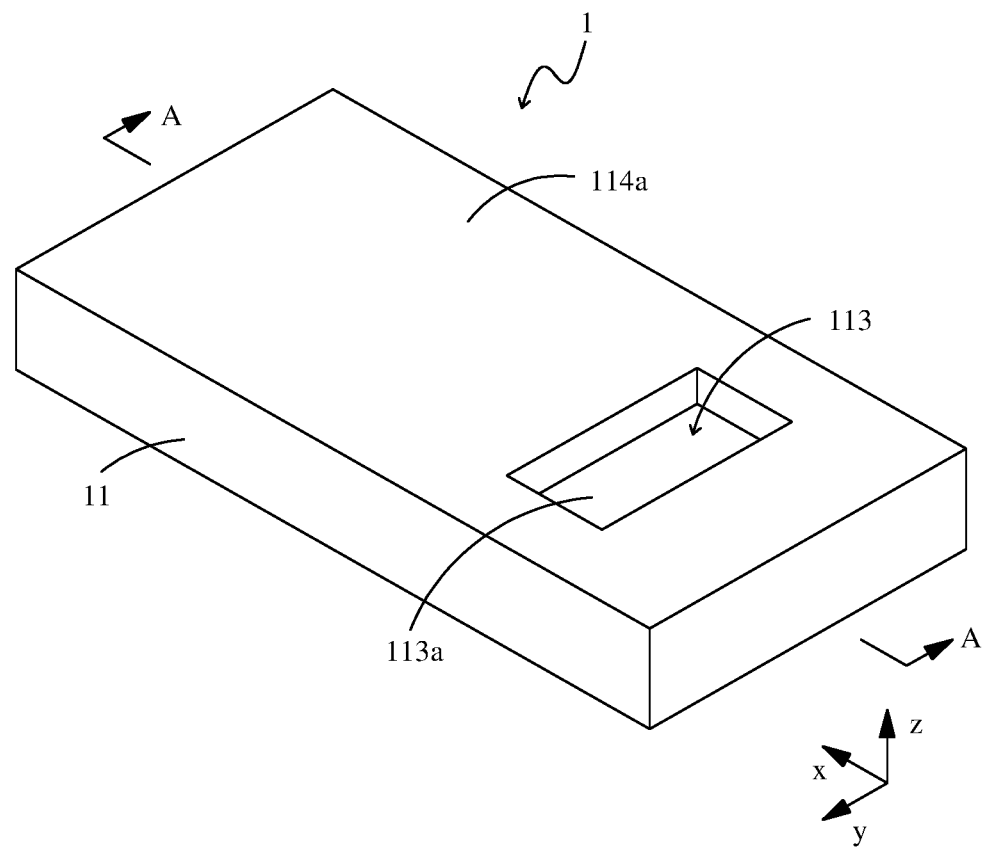
FIG. 4 is a schematic diagram of a structure of a first embodiment of a temperature equalization component according to an embodiment of this application.
Figure 5:
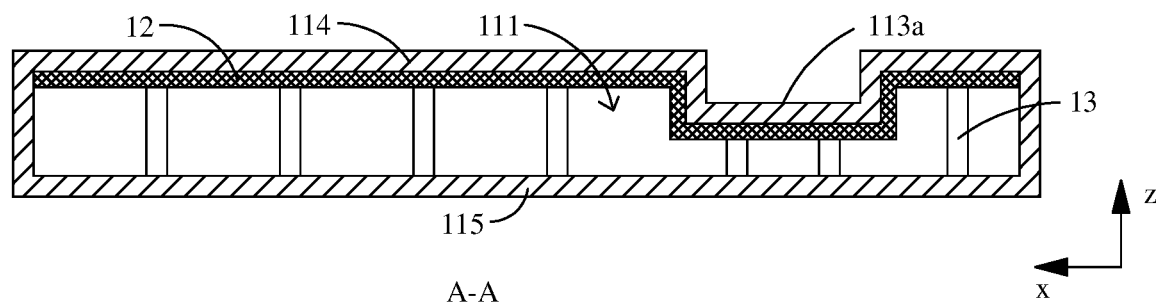
FIG. 5 is a sectional view along an A-A direction of FIG. 4.

As shown in FIG. 4 and FIG. 5, this application provides an embodiment. In this embodiment, the first cover plate 114 may be provided with only the first depression part 113, and there may be one or more first depression parts 113. The first depression part 113 depresses towards the inside of the cavity 111. The capillary structure 12 is in a continuous structure and is disposed on a side of the first cover plate 114 that faces the cavity 111, and covers each wall surface of the body part 114a and the first depression part 113. The temperature equalization component 1 in this structure is applicable to a heating element 2 with a relatively large height (a distance between the heating element 2 and the temperature equalization component 1 is relatively small). The first depression part 113 is disposed, so that not only the temperature equalization component 1 can be in direct contact with the heating element 2, but also an overall thickness of the electronic device can be decreased.

The first depression part 113 may include a first contact surface 113a, and the first contact surface 113a is configured to be in contact with the heating element 2. To improve heat dissipation efficiency of the temperature equalization component 1, an area of the first contact surface 113a is usually greater than an area of the heating element 2, so that the heating element 2 can be in full contact with the temperature equalization component 1, thereby improving efficiency of heat transfer between the temperature equalization component 1 and the heating element 2, increasing a speed of transferring heat from the heating element 2 to the temperature equalization component 1, and reducing a probability that the heating element 2 cannot work normally because heat generated by the heating element 2 accumulates inside or around the heating element 2.

Figure 6:
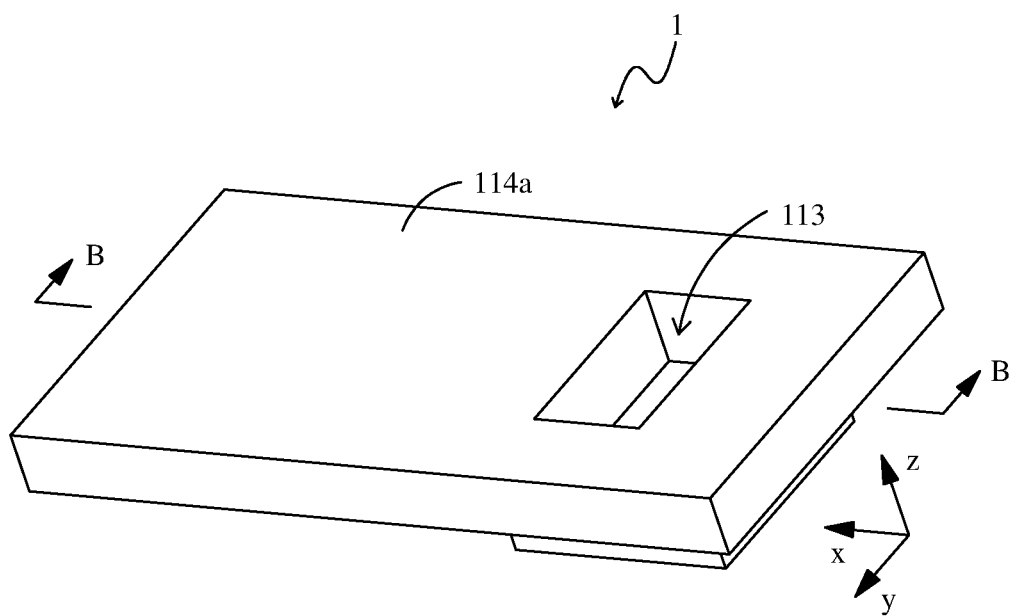
FIG. 6 is a schematic diagram of a structure of a second embodiment of a temperature equalization component according to an embodiment of this application.
Figure 7:
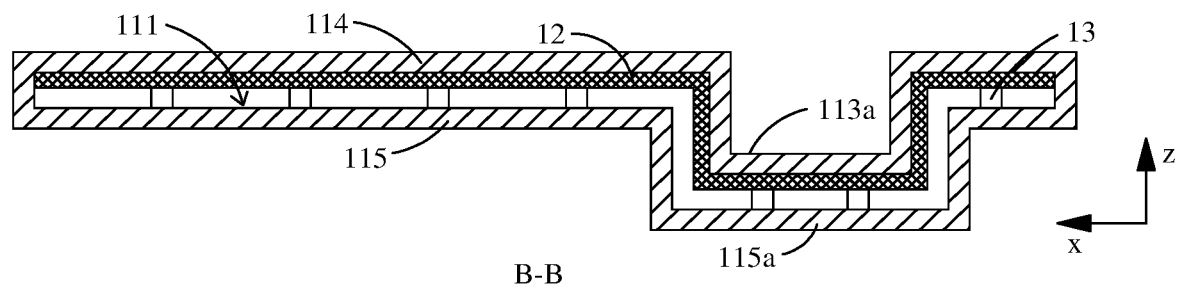
FIG. 7 is a cutaway view of FIG. 6 in a B-B direction.

As shown in FIG. 6 and FIG. 7, an embodiment of this application provides a temperature equalization component 1. The housing 11 may include the first cover plate 114 and a second cover plate 115 that are disposed opposite to each other. The second cover plate 115 is disposed on a side of the housing 11 that is away from the heating element 2. The first cover plate 114 is provided with the first depression part 113, and the first depression part 113 is configured to be in contact with the heating element 2. When a height of the heating element 2 is relatively large, a depression depth of the first depression part 113 deepens. When the depression depth of the first depression part 113 reaches a specific limit, the first depression part 113 is pressed against the second cover plate 115. As a result, the second cover plate 115 prevents the first depression part 113 from depressing, and further prevents the temperature equalization component 1 from being in contact with the heating element 2.

To resolve this technical problem, the second cover plate 115 in this embodiment is provided with a second depression part 115a. The second depression part 115a has a same depression direction as the first depression part 113, to be specific, the second depression part 115a depresses towards the outside of the cavity 111. At least a part of the first depression part 113 can extend into the second depression part 115a. The second depression part 115a may be configured to avoid the first depression part 113, so that the first depression part 113 has a depression depth large enough, and the temperature equalization component 1 can be in full contact with the heating element 2, thereby improving heat dissipation efficiency of the temperature equalization component 1.

Figure 8:
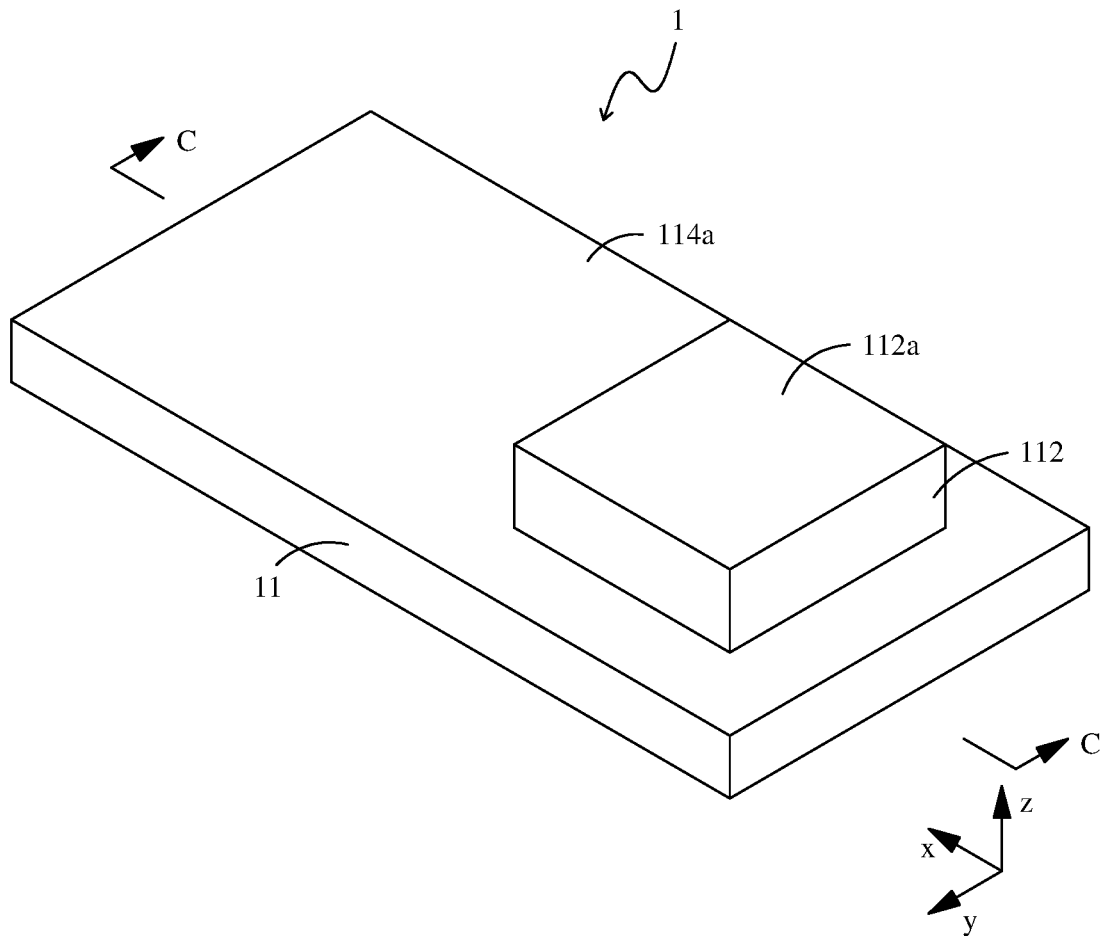
FIG. 8 is a schematic diagram of a structure of a third embodiment of a temperature equalization component according to an embodiment of this application.
Figure 9:
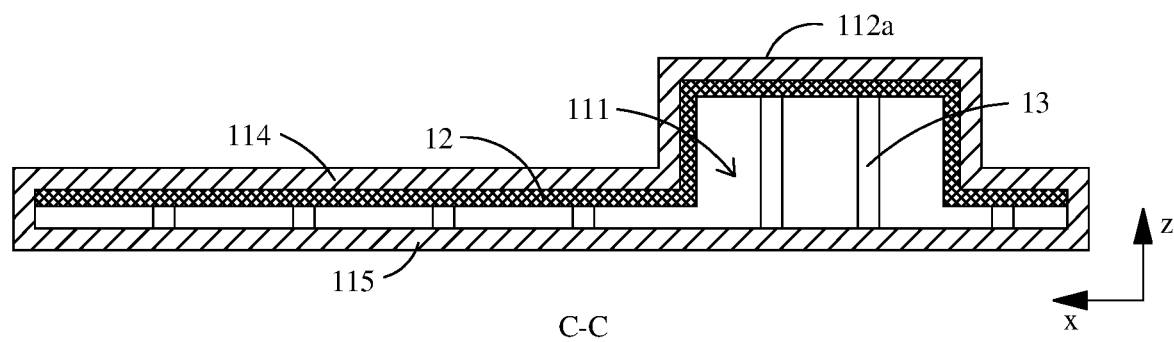
FIG. 9 is a cutaway view of FIG. 8 in a C-C direction.

As shown in FIG. 8 and FIG. 9, this application provides an embodiment. The first cover plate 114 may be provided with only the first protrusion part 112, and there may be one or more first protrusion parts 112. The first protrusion part 112 protrudes towards the outside of the cavity 111. The capillary structure 12 is in a continuous structure and is disposed on a side of the first cover plate 114 that faces the cavity 111, and covers each wall surface, of the body part 114a and the first protrusion part 112, that faces the cavity 111. The temperature equalization component 1 in this structure is applicable to a heating element 2 with a relatively small height (a distance between the heating element 2 and the temperature equalization component 1 is relatively large). The first protrusion part 112 is disposed, so that the temperature equalization component 1 can be in contact with the heating element 2, to improve heat transfer efficiency, reduce a probability of heat accumulation, and improve a heat dissipation effect of the temperature equalization component 1.

Figure 10:
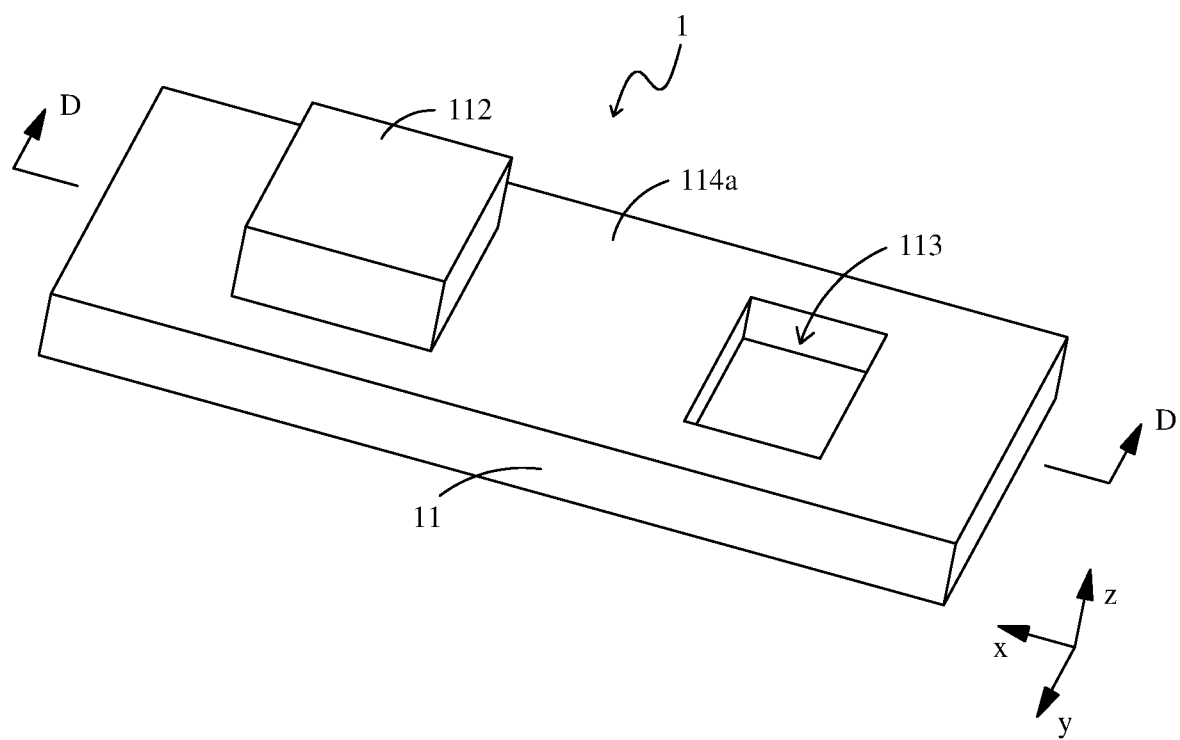
FIG. 10 is a schematic diagram of a structure of a fourth embodiment of a temperature equalization component according to an embodiment of this application.
Figure 11:
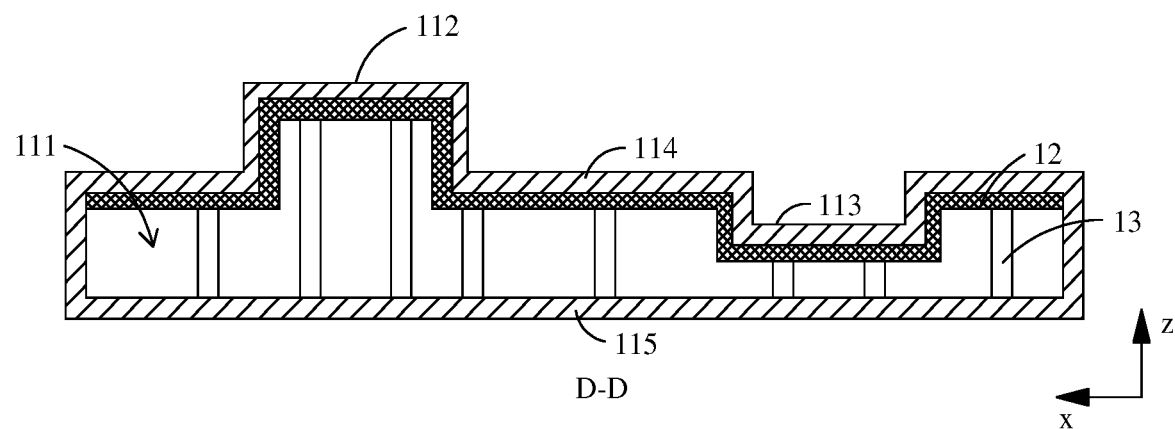
FIG. 11 is a cutaway view of FIG. 10 in a D-D direction.
Figure 12:
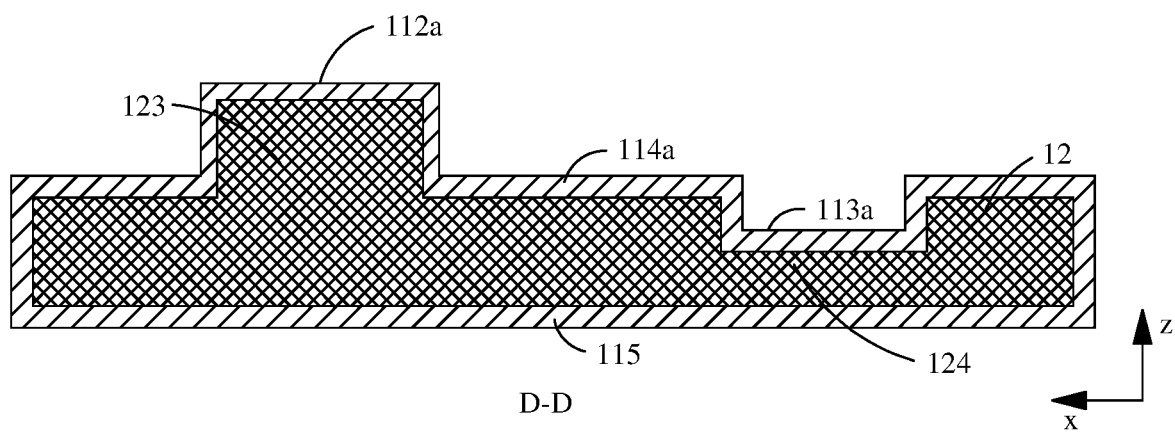
FIG. 12 is a cutaway view of another embodiment of FIG. 10 in a D-D direction.

As shown in FIG. 10 to FIG. 12, this application provides an embodiment. The first cover plate 114 is provided with both the first protrusion part 112 and the first depression part 113. The first protrusion part 112 protrudes towards the outside of the cavity 111, and the first depression part 113 depresses towards the inside of the cavity 111. The capillary structure 12 is in a continuous structure and is disposed on a side of the first cover plate 114 that faces the cavity 111, and covers each wall surface, of the body part 114a, the first protrusion part 112, and the first depression part 113, that faces the cavity 111. The first protrusion part 112 is configured to be in contact with a heating element 2 with a relatively small height, and the first depression part 113 is configured to be in contact with a heating element 2 with a relatively large height.

According to this embodiment provided in this application, both the first protrusion part 112 and the first depression part 113 are disposed, so that the temperature equalization component 1 can be simultaneously in contact with a plurality of heating elements 2 with different heights. In this design, a plurality of temperature equalization components 1 do not need to be disposed inside the electronic device to dissipate heat, and one temperature equalization component 1 may be configured to simultaneously dissipate heat from a plurality of heating elements 2, thereby improving heat dissipation efficiency and use efficiency of the temperature equalization component 1, reducing costs of the electronic device, and reducing complexity of the electronic device.

Specifically, in each of the foregoing embodiments, the first protrusion part 112 may include a second contact surface 112a, and the first depression part 113 may include the first contact surface 113a. The first contact surface 113a and the second contact surface 112a are separately configured to be in contact with different heating elements 2. An area of the first contact surface 113a is greater than an area of the heating element 2 in contact with the first contact surface 113a, and an area of the second contact surface 112a is greater than an area of the heating element 2 in contact with the second contact surface 112a. This design enables the heating element 2 to be in full contact with the temperature equalization component 1 to improve efficiency of heat conduction between the heating element 2 and the temperature equalization component 1, so that heat generated by the heating element 2 is rapidly absorbed by the temperature equalization component 1, a probability that heat accumulates around the heating element 2 is reduced, and the heating element 2 can work normally.

More specifically, the first protrusion part 112, the first depression part 113, and the second depression part 115a may be integrally formed through stamping when the first cover plate 114 and the second cover plate 115 are processed.

Figure 15:
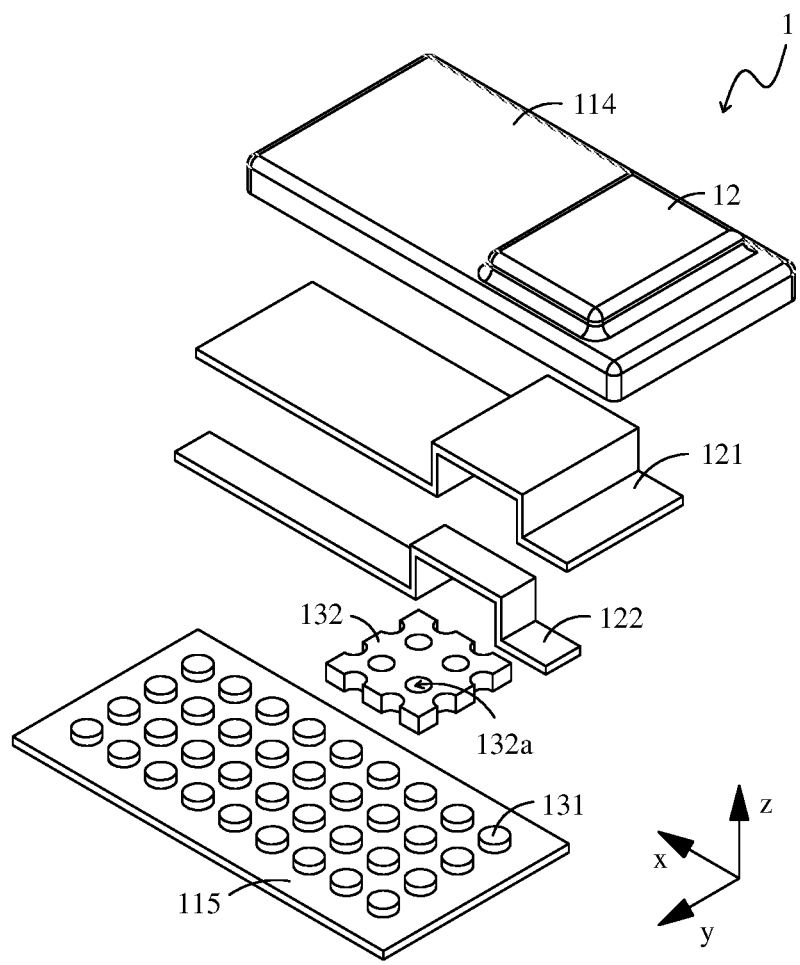
FIG. 15 is an exploded diagram of a sixth embodiment of a temperature equalization component according to an embodiment of this application.

As shown in FIG. 15, this application provides an embodiment. The capillary structure 12 may include a first capillary structure 121 and a second capillary structure 122, and a capillary rate of the second capillary structure 122 is greater than a capillary rate of the first capillary structure 121. The capillary rate is a percentage occupied in a total volume by a volume of a hole configured to store a heat-conducting medium in the capillary structure 12, and an increase in the capillary rate of the capillary structure 12 enables the capillary structure 12 to store more heat-conducting media, thereby improving heat conduction efficiency of the temperature equalization component 1. According to this embodiment provided in this application, the second capillary structure 122 with a larger capillary rate is disposed to improve an overall capillary rate of the capillary structure 12, thereby improving heat conduction efficiency of the temperature equalization component 1. In addition, when a heat-conducting medium stored in the capillary structure 12 absorbs heat and generates a phase change, for example, a liquid heat-conducting medium stored in the capillary structure 12 absorbs heat and is gasified, and is converted into a gaseous heat-conducting medium to flow out of the capillary structure 12, when the gaseous heat-conducting medium is away from the heating element 2 or is in contact with the second cover plate 115 of the housing 11, the gaseous heat-conducting medium becomes the liquid heat-conducting medium again through condensation, and under a capillary function of the capillary structure 12, the liquid heat-conducting medium is collected again, and the liquid heat-conducting medium is enabled to follow a hole of the capillary structure 12 to flow towards a direction close to the heating element 2, to continue to absorb heat generated by the heating element 2, so that the temperature equalization component 1 can continue to work.

In addition, the second capillary structure 122 has a higher capillary rate. Therefore, a capillary function of the second capillary structure 122 has a better effect, and a condensed liquid heat-conducting medium can be collected again, to reduce a probability that a liquid heat-conducting medium obtained after a gaseous heat-conducting medium is condensed cannot be collected again by the capillary structure 12, thereby improving utilization of a heat-conducting medium and improving heat conduction efficiency of the temperature equalization component 1.

In a possible embodiment, the first capillary structure 121 may be a mesh capillary structure, and the second capillary structure 122 may be a fabric capillary structure. The fabric capillary structure has a higher capillary rate than the mesh capillary structure, can store more heat-conducting media, and can easily collect a cooled heat-conducting medium.

Moreover, the temperature equalization component 1 may include a high-temperature region and a low-temperature region. The high-temperature region is a region of the temperature equalization component 1 that is close to the hot heating element 2, and the low-temperature region is a region of the temperature equalization component 1 that is away from the hot heating element 2. A heat-conducting medium absorbs heat in the high-temperature region and generates a phase change, and then flows into the low-temperature region. The heat-conducting medium is cooled in the low-temperature region, and releases the absorbed heat to restore to an initial state, to complete a heat dissipation process.

Specifically, the second capillary structure 122 and the first capillary structure 121 are disposed in a thickness direction Z of the temperature equalization component 1, and are pressed against each other to reduce space occupied by the capillary structure 12. An area of the second capillary structure 122 may be less than an area of the first capillary structure 121. In this embodiment, a channel can be formed in a region in which the second capillary structure 122 is not disposed, where the channel can be used by a heat-conducting medium whose phase changes to flow out and be away from the hot heating element 2. The heat-conducting medium can reach the low-temperature region through the channel, so that the heat-conducting medium can take heat away from the heating element 2, to reduce a probability that the heat still accumulates in the high-temperature region because the heat-conducting medium whose phase changes cannot flow into the low-temperature region due to insufficient space inside the temperature equalization component 1, thereby improving heat dissipation efficiency.

As shown in FIG. 12, an embodiment of this application provides a temperature equalization component 1. The capillary structure 12 may be formed by sintering metal powder. Generally, copper powder is selected for sintering, and the copper powder may be disposed on the first cover plate 114 or the second cover plate 115. The copper powder is sintered at high temperature, so that the copper powder can form the capillary structure 12. The capillary structure 12 processed in this manner has good rigidity and strength. The capillary structure 12 can be directly pressed against the housing 11 to support the housing 11, thereby improving strength and rigidity of the temperature equalization component 1. The capillary structure 12 may be a mesh capillary structure. A plurality of layers of mesh capillary structures are disposed, so that the capillary structure 12 can be pressed against the first cover plate 114 and the second cover plate 115 and support the housing 11.

Specifically, a thickness of the capillary structure 12 may be increased or decreased at a corresponding location based on a location of the first protrusion part 112 and/or a location of the first depression part 113, so that a second protrusion part 123 and/or a third depression part 124 are/is formed in the capillary structure 12. The second protrusion part 123 may be pressed against the first protrusion part 112 and the second cover plate 115, and the third depression part 124 may be pressed against the first depression part 113 and the second cover plate 115, so that the capillary structure 12 can provide support for the first protrusion part 112 and/or the first depression part 113, thereby further improving overall structural strength of the temperature equalization component 1.

When the capillary structure 12 is formed through sintering, a part of space may be reserved in advance. The capillary structure 12 is formed through sintering only at a partial location of the first cover plate 114 or the second cover plate 115, and a channel is formed at a location at which the capillary structure 12 is not disposed, so that a heat-conducting medium whose phase changes can flow from the high-temperature region to the low-temperature region.

As shown in FIG. 5, FIG. 7, FIG. 9, and FIG. 11, the housing 11 of the temperature equalization component 1 provided in this application may include the first cover plate 114 and the second cover plate 115, and the first cover plate 114 and the second cover plate 115 form the cavity 111. The temperature equalization component 1 may further include a support structure 13, and the support structure 13 is located in the cavity 111, and is configured to support the first cover plate 114 and the second cover plate 115. This design can improve overall strength of the temperature equalization component 1, and reduce a probability that the temperature equalization component 1 is deformed due to extrusion of external force, thereby reducing a risk that the temperature equalization component 1 is broken or damaged, and prolonging a service life of the temperature equalization component 1.

Specifically, in a specific embodiment, as shown in FIG. 5, FIG. 7, FIG. 9, and FIG. 11, the support structure 13 may include a support pole 131, and the support pole 131 may be integrally formed with the first cover plate 114 or the second cover plate 115. During processing, support poles 131 with different heights are processed on the first cover plate 114 and/or the second cover plate 115 through stamping, so that the support pole 131 provides support between the body part 114a and the second cover plate 115, the support pole 131 provides support between the first protrusion part 112 and the second cover plate 115, and/or the support pole 131 provides support between the first depression part 113 and the second cover plate 115, to reduce a probability that the first protrusion part 112 and/or the first depression part 113 are/is deformed due to impact of force, and reduce a risk of deformation of the first contact surface 113a and/or the second contact surface 112a. Therefore, the first contact surface 113a and/or the second contact surface 112a can be in better contact with the hot heating element 2, to improve heat dissipation efficiency of the temperature equalization component 1.

In another specific embodiment, the support pole 131 may be separately processed. During assembly of the temperature equalization component 1, the support pole 131 is installed in the cavity 111, and two ends of the support pole 131 are respectively pressed against the first cover plate 114 and the second cover plate 115 to provide support for the housing 11. In this manner, support poles 131 with different lengths may be pre-processed during processing, and a support pole 131 with a proper length is selected for use during assembly based on an actual requirement, and a stamping mold does not need to be separately designed based on a length difference of the support pole 131, thereby reducing development costs.

As shown in FIG. 15, this application provides an embodiment. The support structure 13 may include a support pole 131 and a foam metal layer 132. The support pole 131 is configured to support the body part 114a and the second cover plate 115, and the foam metal layer 132 is configured to support the first protrusion part 112 and the second cover plate 115, and/or the first depression part 113 and the second cover plate 115, so as to strengthen the temperature equalization component 1 and improve structural strength of the temperature equalization component 1.

Specifically, as shown in FIG. 15, the foam metal layer 132 may be provided with a through-hole 132a, and the through-hole 132a penetrates the foam metal layer 132 in the thickness direction Z. The through-hole 132a may serve as a channel through which a heat-conducting medium flows. A heat-conducting medium whose phase changes is away from the high-temperature region through the channel and reaches the low-temperature region, to release absorbed heat.

When working efficiency of the capillary structure 12 is not affected, a channel may be disposed in the capillary structure 12. This design can be more helpful for the heat-conducting medium whose phase changes to flow into the low-temperature region.

Figure 13:
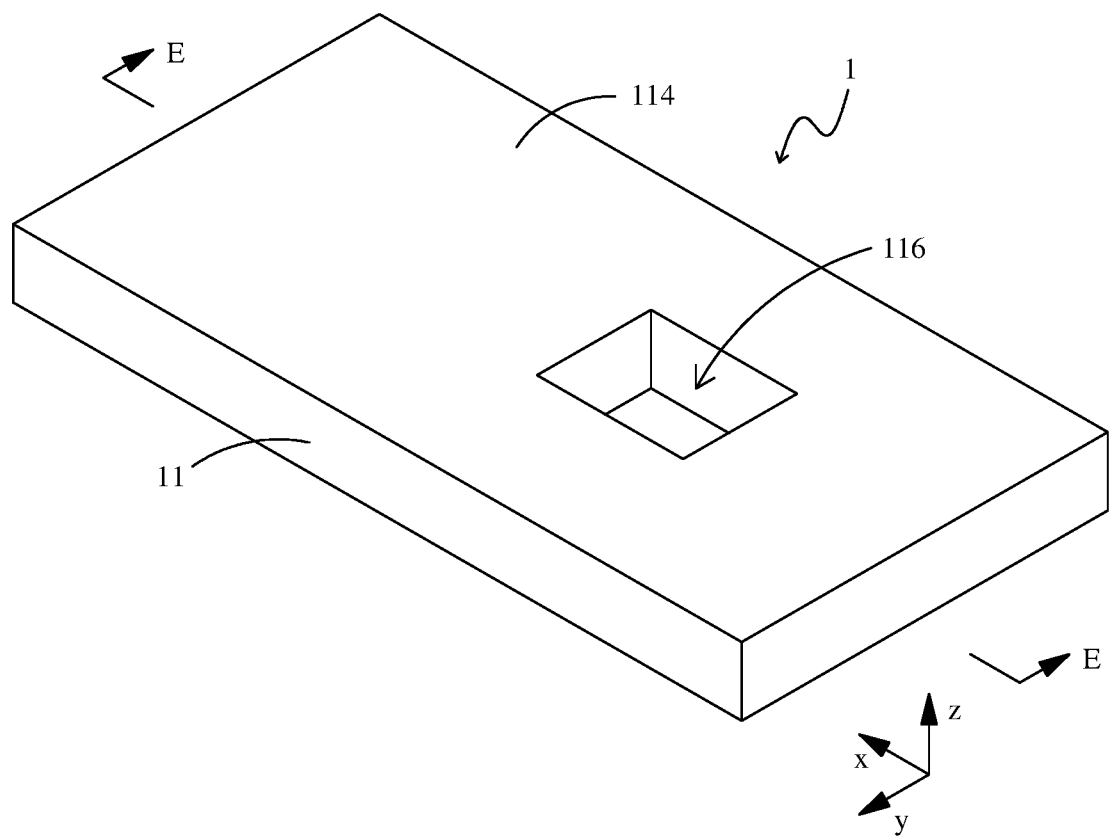
FIG. 13 is a schematic diagram of a structure of a fifth embodiment of a temperature equalization component according to an embodiment of this application.
Figure 14:
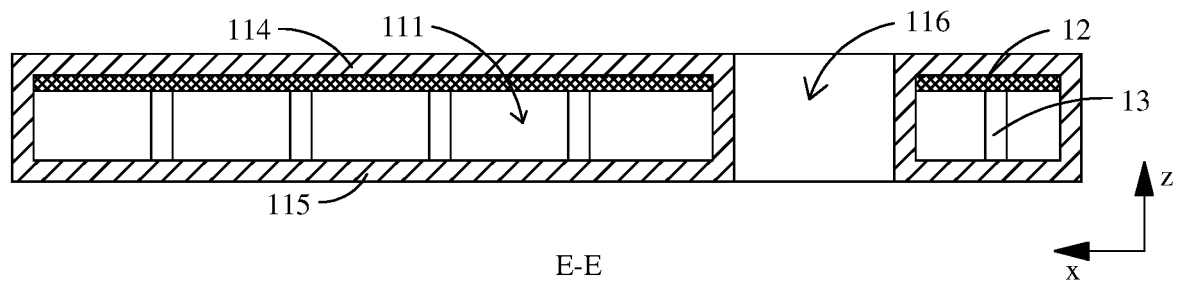
FIG. 14 is a cutaway view of FIG. 13 in an E-E direction.

As shown in FIG. 13 and FIG. 14, this application provides an embodiment. The temperature equalization component 1 may include an avoidance hole 116, and the avoidance hole 116 penetrates the temperature equalization component 1 in a thickness direction of the temperature equalization component 1. The avoidance hole 116 is configured to avoid an electronic element with a relatively large height. The electronic element may be an electronic element that generates a relatively small amount of heat and whose heat does not need to be dissipated by the temperature equalization component 1. The avoidance hole 116 is disposed, so that a thickness of the electronic device can be decreased, thereby following a trend of lightening and thinning the electronic device.

Figure 2:
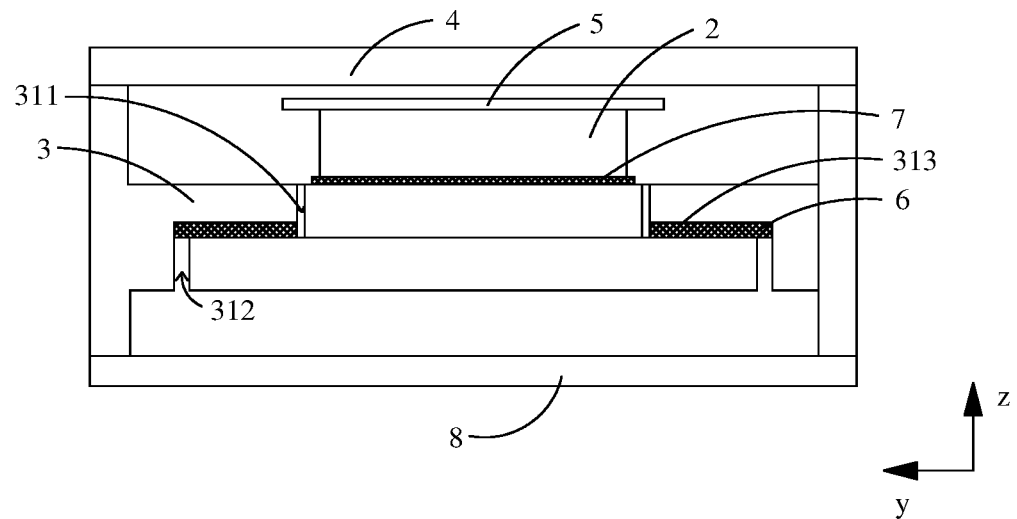
FIG. 2 is a sectional view of FIG. 1.
Figure 3:
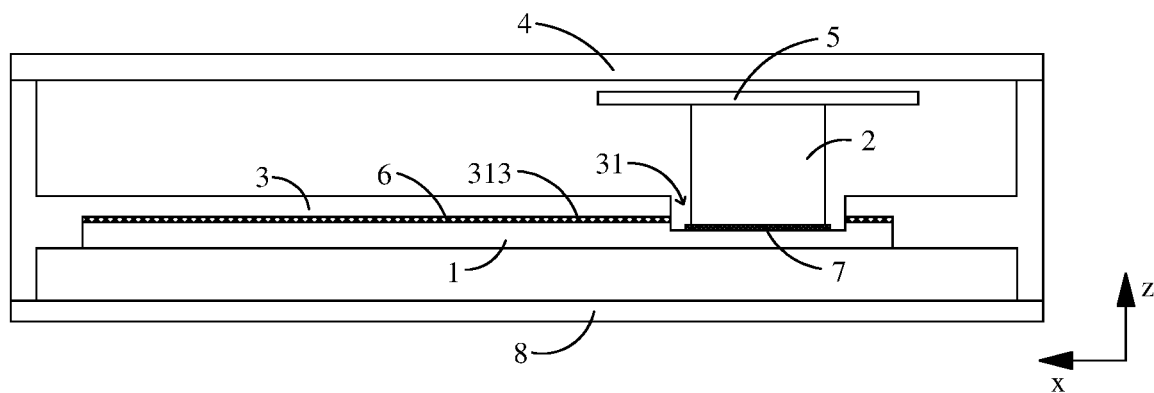
FIG. 3 is a schematic diagram of a structure in which another embodiment of a temperature equalization component is applied to an electronic device according to an embodiment of this application.

Based on the temperature equalization component 1 in the foregoing embodiments, as shown in FIG. 1 to FIG. 3, an embodiment of this application further provides an electronic device. The electronic device may include a screen 8, a heating element 2, a mounting bracket 3, and a temperature equalization component 1. The temperature equalization component 1 is connected to the mounting bracket 3, and a connection manner may be bonding. An adhesive substance 6 may be disposed between the temperature equalization component 1 and the mounting bracket 3, so that the temperature equalization component 1 is connected to the mounting bracket 3.

The mounting bracket 3 may be further provided with a battery compartment configured to install a battery, and an installation part of another component. The mounting bracket 3 is provided with a connecting hole 31. The heating element 2 is installed on a housing 4 by using a circuit board 5. The heating element 2 is in contact with a first protrusion part 112 and/or a first depression part 113 by using the connecting hole 31. In a possible embodiment, a heat-conducting interface material 7 is disposed between the heating element 2 and the first protrusion part 112 and/or the first depression part 113. The heat-conducting interface material 7 may be silicone rubber. The heating element 2 is more firmly connected to the temperature equalization component 1 by using the heat-conducting interface material 7, thereby improving connection stability and improving efficiency of heat conduction between the heating element 2 and the temperature equalization component 1.

A manner of connection between the temperature equalization component 1 and the mounting bracket 3 may alternatively be as follows: Metal is disposed on the mounting bracket 3 and/or a housing of the temperature equalization component 1, and the metal is heated to melt. After the metal is melted, the temperature equalization component 1 is connected to the mounting bracket 3, and the metal is cooled. After the metal is solidified, the temperature equalization component 1 is connected to the mounting bracket 3. Connection between the temperature equalization component 1 and the mounting bracket 3 may further include any other manner that meets a strength requirement.

Specifically, this application provides an embodiment. The temperature equalization component 1 may include a first cover plate 114. The first cover plate 114 may include a body part 114a, the first protrusion part 112, and/or the first depression part 113. The connecting hole 31 may include a first hole segment 311 and a second hole segment 312. The first hole segment 311 and the second hole segment 312 are connected to each other, and a cross-sectional area of the first hole segment 311 is less than a cross-sectional area of the second hole segment 312, so that a step surface 313 is formed between the first hole segment 311 and the second hole segment 312. When the temperature equalization component 1 is installed on the mounting bracket 3, the body part 114a is located in the second hole segment 312. The body part 114a may be connected to the step surface 313 by adhesive substance 6, so that the vapor chamber 1 can be fixedly connected to the mounting bracket 3. At least a part of at least one of the first protrusion part 112 and the heating element 2 extends into the first hole segment 311, so that the first protrusion part 112 can be in contact with the heating element 2. Alternatively, the body part 114a is located in the second hole segment 312, and the heating element 2 extends into the first hole segment 311 and penetrates the first hole segment 311 to be in contact with the first depression part 113. The heat-conducting interface material 7 may be disposed between the heating element 2 and the temperature equalization component 1. This design manner helps to position the temperature equalization component 1 and/or the heating element 2 during installation, and decreases an overall thickness of the electronic device, thereby following a trend of lightening and thinning the electronic device.

In conclusion, the embodiments of this application provide the temperature equalization component 1, including the cavity 111 and the capillary structure 12. The capillary structure 12 is located in the cavity 111, and the capillary structure 12 is disposed on the side of the housing 11 that faces the heating element 2. The temperature equalization component 1 is in an unequal-thickness structure. The housing 11 is provided with the first protrusion part 112 and/or the first depression part 113, and is in direct contact, by using the first protrusion part 112 and/or the first depression part 113, with the heating element 2 that generates heat, so that heat does not need to be transferred by using another component, thereby improving heat conduction efficiency. Therefore, heat dissipation efficiency of the temperature equalization component 1 is improved, and a probability of heat accumulation is reduced, and temperature of the heating element 2 and temperature of an environment in which the heating element 2 is located are decreased, so that the heating element 2 is in a good working state, and the electronic device operates more smoothly, thereby reducing a probability that the electronic device is hot or frozen, and improving use experience of a user.

The foregoing descriptions are merely embodiments of this application, but are not intended to limit this application. For a person skilled in the art, various changes and variations may be made in this application. Any modification, equivalent replacement, or improvement made without departing from the spirit and principle of this application should fall in the protection scope of this application.

What is claimed is:

1. A temperature equalization component, comprising:
   a housing, and a capillary structure, wherein the housing comprises a cavity, and the capillary structure is located in the cavity;
   the housing is provided with a first protrusion part and/or a first depression part that are/is configured to be in contact with an element to which the temperature equalization component is applicable to decrease temperature of the element; and the capillary structure is disposed on only a side of the housing that is closest to a side of the element among all the sides of the housing, wherein the housing comprises a first cover plate and a second cover plate that are disposed opposite to each other, the first cover plate facing the element, and the second cover plate being away from the element;

the first cover plate comprises a body part, the first protrusion part and/or the first depression part are/is disposed on the first cover plate the first protrusion part protrudes from the body part, and/or the first depression part depresses relative to the body part; and the capillary structure only covers the first cover plate including the body part, the first protrusion part and/or the first depression part while leaving the second cover plate uncovered by a capillary structure.

2. The temperature equalization component according to claim 1, wherein the first depression part depresses towards an inner portion of the cavity; and the first depression part comprises a first contact surface configured to be in contact with the element, and an area of the first contact surface is greater than an area of the element in contact with the first contact surface.

3. The temperature equalization component according to claim 2, wherein the housing is provided with the first depression part, a second depression part is disposed on a side of the second cover plate that is away from the element, and the second depression part has a same depression direction as the first depression part; and at least a part of the first depression part extends into the second depression part.

4. The temperature equalization component according to claim 1, wherein the first cover plate is provided with the first protrusion part and the first depression part, the first protrusion part protrudes towards an outer portion of the cavity, and the first depression part depresses towards an inner portion of the cavity; and the first protrusion part is configured to be in contact with one part of the element, and the first depression part is configured to be in contact with another part of the element.

5. The temperature equalization component according to claim 4, wherein the first protrusion part comprises a second contact surface configured to be in contact with the element, and an area of the second contact surface is greater than an area of the element in contact with the second contact surface; and the first depression part comprises a first contact surface configured to be in contact with the element, and an area of the first contact surface is greater than an area of the element in contact with the first contact surface.

6. The temperature equalization component according to claim 1, wherein the capillary structure comprises a first capillary structure and a second capillary structure, and a capillary rate of the second capillary structure is greater than a capillary rate of the first capillary structure.

7. The temperature equalization component according to claim 6, wherein the first capillary structure is pressed against the second capillary structure in a thickness direction of the temperature equalization component; and an area of the second capillary structure is less than an area of the first capillary structure.

8. The temperature equalization component according to claim 1, wherein the capillary structure is pressed against the housing to support the housing.

9. The temperature equalization component according to claim 8, wherein a thickness of the capillary structure increases or decreases at a corresponding location based on a location of the first protrusion part and/or a location of the first depression part, so that a second protrusion part and/or a third depression part are/is formed in the capillary structure, the second protrusion part is disposed corresponding to the first protrusion part, and the third depression part is disposed corresponding to the first depression part.

10. The temperature equalization component according to claim 1, wherein the temperature equalization component comprises a support structure located in the cavity, and the support structure is configured to support the first cover plate and the second cover plate.

11. The temperature equalization component according to claim 10, wherein the support structure comprises a support pole; and the support pole and the housing are integrally formed or separated structures with two ends of the support pole being respectively pressed against the housing and the capillary structure.

12. The temperature equalization component according to claim 10, wherein the first cover plate comprises a body part, the first protrusion part and/or the first depression part are/is disposed on the first cover plate, the first protrusion part protrudes from the body part, and/or the first depression part depresses relative to the body part;

the support structure comprises a foam metal layer and a support pole, and the support pole is configured to support the body part and the second cover plate;

the foam metal layer is configured to support the first protrusion part and the second cover plate, and/or the foam metal layer is configured to support the first depression part and the second cover plate; and the foam metal layer is provided with a through-hole, and the through-hole penetrates the foam metal layer in a thickness direction.

13. The temperature equalization component according to claim 1, further comprising an avoidance hole, and the avoidance hole penetrates the temperature equalization component in a thickness direction of the temperature equalization component.

14. An electronic device, comprising:

an element, a mounting bracket, and a temperature equalization component that is applicable the element to decrease temperature of the element, wherein the temperature equalization component is connected to the mounting bracket, the mounting bracket comprises a connecting hole, and the element is pressed against a first protrusion part and/or a first depression part by using the connecting hole;

the temperature equalization component comprises: a housing and a capillary structure, wherein the housing comprises a cavity, and the capillary structure is located in the cavity;

the housing is provided with a first protrusion part and/or a first depression part that are/is configured to be in contact with an element; and the capillary structure is disposed on a side of the housing that is close to a side of the heating element, and wherein the housing comprises a first cover plate the first cover plate comprises a body part, and the first protrusion part and/or a first recess part are/is disposed on the fist cover plate;

the connecting hole comprises a first hole segment and a second hole segment, the first hole segment and the second hole segment are connected to each other, a cross-sectional area of the first hole segment is less than a cross-sectional area of the second hole segment, and a step surface is forme between the first hole segment and the second hole segment;

the body part is located in the second hole segment, and is pressed against the step surface; and at least a part of at least one of the first protrusion part, the first depression part, and the element is located in the first hole segment.

15. The electronic device according to claim 14, wherein the first cover plate is close to the element;

the first cover plate comprises a body part, the first protrusion part and/or the first depression part are/is disposed on the first cover plate, the first protrusion part protrudes from the body part, and/or the first depression part depresses relative to the body part; and the capillary structure covers the body part, the first protrusion part, and/or the first depression part.

16. The electronic device according to claim 15, wherein the first depression part depresses towards an inner portion of the cavity; and the first depression part comprises a first contact surface configured to be in contact with the element, and an area of the first contact surface is greater than an area of the heating element in contact with the first contact surface.

17. The electronic device according to claim 16, wherein the housing further comprises a second cover plate disposed opposite to the first cover plate, a second depression part is disposed on a side of the second cover plate that is away from the heating element, and the second depression part has a same depression direction as the first depression part; and at least a part of the first depression part extends into the second depression part.

18. The electronic device according to claim 15, wherein the first cover plate is provided with the first protrusion part and the first depression part, the first protrusion part protrudes towards an outer portion of the cavity, and the first depression part depresses towards an inner portion of the cavity; and the first protrusion part is configured to be in contact with one part of the element, and the first depression part is configured to be in contact with another part of the element.

* * * * *

UNITED STATES PATENT AND TRADEMARK OFFICE
CERTIFICATE OF CORRECTION

PATENT NO. : 12,336,146 B2  
APPLICATION NO. : 17/732684  
DATED : June 17, 2025  
INVENTOR(S) : Yongfu Sun et al.

Page 1 of 1

It is certified that error appears in the above-identified patent and that said Letters Patent is hereby corrected as shown below:

In the Claims

Column 18, Claim 14, Line 61, change "heating element;" to --element,--;

Column 18, Claim 14, Line 65, change "fist;" to --first--.

Column 19, Claim 14, Line 4, change "forme;" to --formed--.

Column 20, Claim 16, Line 2, change "heating element;" to --element--; and

Column 20, Claim 17, Line 5, change "heating element;" to --element--.

Signed and Sealed this  
Fifteenth Day of July, 2025

Coke Morgan Stewart  
*Acting Director of the United States Patent and Trademark Office*